Figure 1:
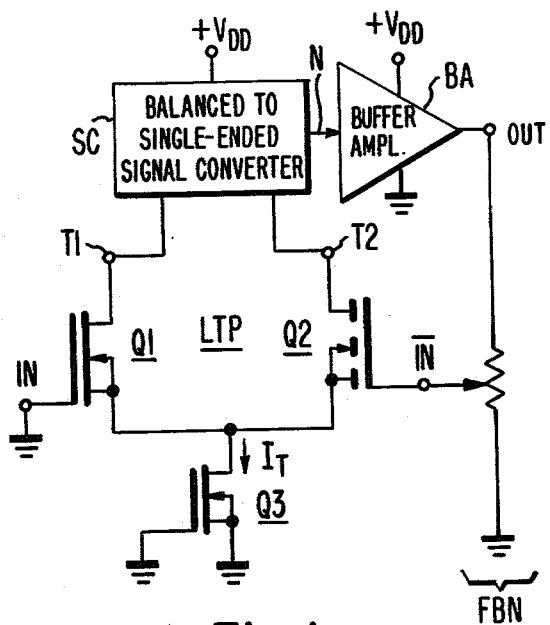

United States Patent [19]
Dingwall

[11] 4,188,588
[45] Feb. 12, 1980

[54] CIRCUITRY WITH UNBALANCED LONG-TAILED-PAIR CONNECTIONS OF FET'S

[75] Inventor: Andrew G. F. Dingwall, Bridgewater, N.J.

[73] Assignee: RCA Corporation, New York, N.Y.

[21] Appl. No.: 969,784

[22] Filed: Dec. 15, 1978

[51] Int. Cl.² ............................................. H03F 3/45
[52] U.S. Cl. ................................... 330/253; 307/350; 330/257; 330/259; 330/260
[58] Field of Search .............. 330/253, 257, 259, 260, 330/310, 311; 307/350, 360, 362

[56] References Cited
U.S. PATENT DOCUMENTS

| | | | |
|---|---|---|---|
| 3,851,241 | 11/1974 | Wheatley, Jr. | 323/8 |
| 4,068,134 | 1/1978 | Tobey, Jr. et al. | 307/297 |
| 4,096,430 | 6/1978 | Waldron | 323/22 R |
| 4,100,437 | 7/1978 | Hoff, Jr. | 307/297 |

*Primary Examiner*—James B. Mullins
*Attorney, Agent, or Firm*—H. Christoffersen; Allen LeRoy Limberg

[57] ABSTRACT

Unbalanced long-tailed-pair configurations of field effect transistors thermally coupled to each other and matched except for dissimilar threshold potentials are used as the input stage of a comparator or of a feedback amplifier for maintaining the difference between their gate potentials constant.

11 Claims, 5 Drawing Figures

CIRCUITRY WITH UNBALANCED LONG-TAILED-PAIR CONNECTIONS OF FET'S

The present invention relates to unbalanced long-tailed-pair connections of transistors and, more particularly, to such connections using field effect transistors (FET's) with dissimilar threshold voltages.

Suppose one considers an electronic valve device such as the vacuum tube or the transistor as being a three-terminal amplifier with input, output and common electrodes, the output and common electrodes defining its principal current conduction path, and the input and common electrodes receptive of an input potential for controlling the conductance of its principal current conduction path. Then a long-tailed-pair configuration can be defined as a pair of said electronic valve devices, with their common electrodes connected together to receive combined quiescent currents from a constant current generator. The long-tailed-pair configuration provides output currents with anti-phase variations at the output electrodes of its component electronic valve devices responsive to variations in the difference between the potentials applied to their respective input electrodes.

In the past long-tailed-pair configurations have included electronic valve devices, both of which could be described as being enhancement-mode or depletion-mode devices, using in a more general manner the parlance that is normally used specifically in regard to field effect transistors (FET's). Most long-tailed-pair configurations employ completely matched devices in order to take advantage of common-mode rejection to suppress shared variation on the input offset voltages of the paired electronic valve devices. This type of long-tailed-pair configuration is said to be "balanced". C. F. Wheatley, Jr., in U.S. Pat. No. 3 851 241, patented 26 Nov. 1974 and entitled "TEMPERATURE DEPENDENT VOLTAGE REFERENCE CIRCUIT", describes an "unbalanced" long-tailed-pair configuration of junction transistors being operated at or about the same temperature T and having dissimilar collector current versus emitter-to-base voltage characteristics. Constant scaling between their collector currents is achieved only by maintaining a difference proportional to the absolute value of T between their respective base electrodes, which is made the basis for thermometric circuitry.

Recently developed ion implantation techniques for controlling the doping of silicon used in forming FET's permit one to obtain FET's with differences ranging from 400 to 2000 mV. in the values of their respective gate voltages associated with threshold of conduction. This can be done to within 10-20 MV. accuracy for FET's that are otherwise similar in dimensions and construction and are located adjacent to each other in an integrated circuit. These differences in the values of gate voltages associated with threshold of conduction are temperature-independent so long as the field effect transistors are operated at the same temperature. This type of operation is exhibited by field effect transistors with close thermal coupling to each other, as is characteristic of transistors located adjacent to each other on an integrated circuit. These differences in gate voltages can be maintained at values of channel current above threshold value so long as provisions are made for properly tracking the channel currents.

The present invention is, then, embodied in circuitry making use of an unblanced long-tailed-pair configuration that includes source-coupled first and second FET's with dissimilar threshold voltages—e.g. in a feedback amplifier arrangement for maintaining the difference between the gate potentials of the first and second FET's constant.

Figure 2:
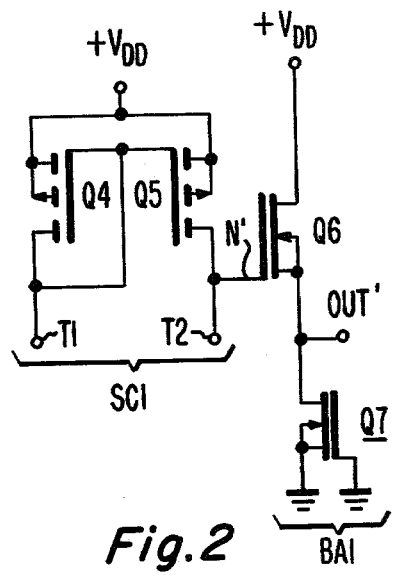
Figure 3:
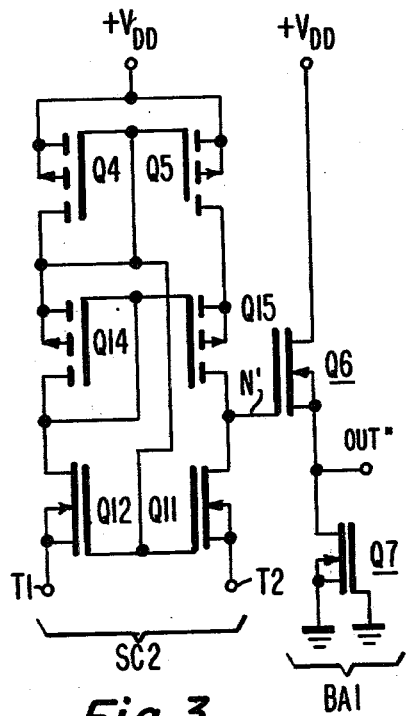
Figure 4:
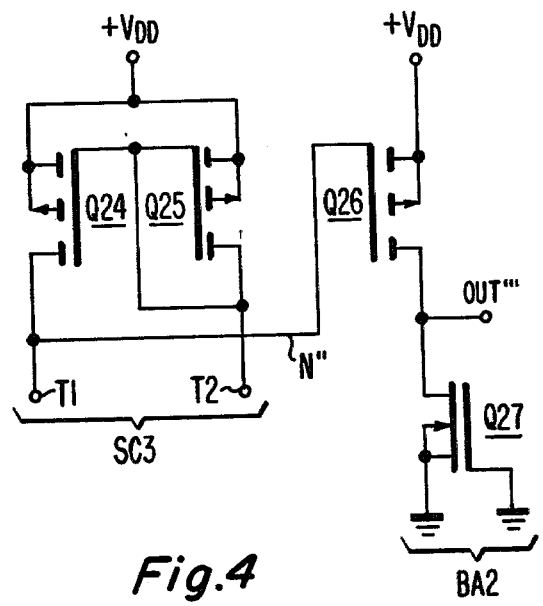
Figure 5:
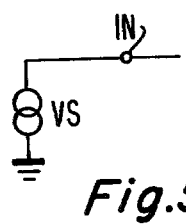

In the drawing:

FIG. 1 is a schematic diagram, partially in block form, of a differential-input voltage comparator, embodying the present invention in a first of its aspects, and of a feedback amplifier arrangement including that comparator, embodying the present invention in a second of its aspects, which feedback amplifier is used for providing a source of regulated voltage, embodying the present invention in still another of its aspects;

FIGS. 2, 3 and 4 are each a schematic diagram of circuitry for balanced to single-ended signal conversion and buffer amplification that can be used in the block portions of FIG. 1 for providing specific embodiments of the present invention; and FIG. 5 is a schematic diagram of a modification that can be made to any of the embodiments of the invention shown in FIGS. 1, 2, 3 and 4, permitting the feedback amplifiers shown in them to amplify an externally applied signal potential.

The FIG. 1 voltage comparator includes a longtailed-pair connection LTP of n-channel FET's Q1 and Q2 assumed to be matched transistors except that their threshold voltages are dissimilar. As shown, Q1 is a depletion-mode FET, exhibiting conduction through a channel between its drain and source electrodes even when its source-to-gate potential is zero-valued or even somewhat negative-valued; and Q2 is an enhancement-mode transistor requiring a positive-valued source-to-gate voltage in order to exhibit substantial conduction through a channel between its drain and source electrodes. The source electrodes of Q1 and Q2 connect without substantial intervening impedance to an interconnection from which a tail current $I_T$ is withdrawn (which may be viewed alternatively as a $-I_T$ current supplied to that interconnection), the flow of $I_T$ being through the drain electrode of another n-channel FET biased for constant conduction. This constant current generator transistor, Q3, is shown as being a depletion-mode transistor with gate electrode as well as source electrode connected to a ground reference potential.

The gate electrodes of Q1 and Q2 are shown as being at a non-inverting signal input terminal IN and at an inverting signal input terminal $\overline{IN}$, respectively, of the FIG. 1 voltage comparator (and feedback amplifier). With Q1 being a depletion-mode n-channel FET, grounding of the terminal IN at its gate electrode still permits Q1 to conduct substantially while its source electrode is at sufficiently positive potential that grounded-source n-channel FET Q3, connected at its drain electrode to the source electrode of Q1, may have sufficient source-to-drain potential to function as a constant current generator.

Terminal $\overline{IN}$ at the base electrode of Q2 will have to be at a still more positive potential than that at the interconnected source electrodes of Q1 and Q2, in order that Q2 is conditioned to conduct a substantial portion of the tail current $I_T$ as compared to Q1.

Continuing the assumption that Q1 and Q2 are matched FET's insofar as size and fabrication are concerned, except for dissimilar doping to cause them to exhibit differing threshold potentials—a balanced to single-ended signal converter SC receptive of the drain currents of Q1 and Q2 applied as input signals via terminals T1 and T2, respectively, will supply an output signal that changes polarity whenever the base potential of Q2 exceeds that of Q1 by the difference in their threshold potentials. If one seeks to simply compare the potential at terminal $\overline{\text{IN}}$ to that at terminal IN plus an offset potential attributable to the difference between the threshold potentials of Q1 and Q2, this is readily done simply with the circuitry thus far described.

However, the output signal from the balanced to single-ended signal converter SC may be used as an error signal when one employs the voltage comparator as thus far described in a direct-coupled feedback amplifier arrangement. This error signal is applied to the input connection of a buffer amplifier BA the output connection of which is at an output terminal OUT of the feedback amplifier. A portion, which portion may be the entirety, of the potential at terminal OUT is applied to the input circuit of a directcoupling feedback network FBN, the output circuit of which supplies an output potential applied to the gate electrode of Q2 for completing a degenerative feedback loop. Feedback network FBN is shown as consisting of a potentiometer operated as a resistive potential divider with end terminals connected at terminal OUT and at ground, respectively, and with a slider terminal connected to terminal $\overline{\text{IN}}$. This degenerative feedback arrangement conditions the feedback amplifier to exhibit a voltage at its output terminal that is equal to the temperature-independent difference between the threshold potentials of Q1 and Q2, multiplied by the factor by which feedback network FBN divides the potential at terminal OUT for application to terminal $\overline{\text{IN}}$.

The buffer amplifier BA may simply be a highgain transresistance amplifier or a high-gain current amplifier supplied an error signal from balanced to single-ended signal converter SC that consists of a static error current of relatively small value. The balanced to single-ended converter may supply a static error signal voltage at relatively low source impedance to a high-gain transconductance amplifier or a high-gain voltage amplifier also. However, of particular interest in integrated FET circuits, particularly those of metal-oxide-semiconductor (MOS) type where gate impedances are very high, are arrangements wherein the balanced to single-ended signal converter SC supplies error current from a high source impedance to a node N subsequently connecting to a very high input impedance transconductance or voltage amplifier. In such case, even the stray capacitance associated with that node introduces sufficient integration into the feedback loop so that static error is eliminated.

FIG. 2 shows one type of apparatus that may be used to fulfill the functions associated with blocks SC and BA of FIG. 1. The balanced to single-ended signal converter SC1 is a current mirror amplifier configuration comprising matched p-channel FET's Q4 and Q5. This configuration has input and output connections at T1 and T2, respectively, and has a common connection to $+V_{DD}$. Directcoupled source-to-gate feedback adjusts the source-to-gate potential of Q4 to condition it to conduct the drain current of Q1; this potential, applied as the source-to-gate potential of Q5, conditions it to conduct a drain current proportional to that of Q4 and thus indirectly to the drain current of Q1. The drain current of Q5 is arranged to have the same quiescent value as that of Q2, though of opposite polarity, so these currents do not alter the charge at N'. The variations from quiescent value of the drain currents of Q2 and Q5 are, however, of the same polarity and combine constructively to alter the charge (and thus the potential) at node N'.

Buffer amplifier BA1 comprises an n-channel source-follower transistor Q6 having its gate electrode connected to node N' to receive the potential thereat and having its source electrode connected to output terminal OUT' to provide it a translated response to the potential at node N'. An n-channel transistor Q7 has its gate biased to condition it to operate as a constant current generator for conducting a current from the source of Q6 to ground appreciably larger than that flowing to feedback network FBN, to maintain the source current of source follower transistor Q6—and thus its source-to-gate potential—more constant.

The high gate resistance of an MOS transistor Q6 tends to permit the stray capacitance at node N' to introduce sufficient integration into the feedback loop to result in zero static error.

FIG. 3 shows a modification of the apparatus thus far described to achieve a higher open-loop gain feedback amplifier, so greater accuracy can be maintained in the loop, particularly in complementary FET technologies where the drain resistances of the FET's are not infinite. A balanced to single-ended signal converter SC1 is used wherein the simple current mirror connection of Q4 and Q5 is augmented with two further matched p-channel FET's Q14 and Q15 in cascode with Q4 and Q5, respectively, to form a more complex current mirror amplifier of the sort described by H. A. Wittlinger in U.S. Pat. No. 3,835,410, patented 10 Sept. 1974 and entitled "CURRENT AMPLIFIER". Matched n-channel FET's Q11 and Q12 are arranged in cascode with Q1 and Q2, respectively. The high load resistance presented to the cascode amplifiers by each other and by the high input resistance at the gate electrode of source follower Q6 results in high voltage gain, because in effect this makes the transconductance versus load resistance products of Q1 and Q2 very high.

The interconnected gate electrodes of Q4 and Q5 may be biased from the interconnection between the source of Q15 and drain of Q5, rather than from the interconnection between the source of Q14 and drain of Q4, (resulting in a current mirror amplifier connection of Q4, Q5, Q14 and Q15 as described by O. H. Schade, Jr. in U.S. Pat. No. 3,852,679, patented 3 Dec. 1974 and entitled "CURRENT MIRROR AMPLIFIERS"), as may the interconnected gate electrodes of Q11 and Q12.

FIG. 4 shows another type of apparatus that can be used to fulfill the functions associated with blocks SC and BA of FIG. 1. The balanced to single-ended signal converter SC3 is a current mirror amplifier configuration comprising matched p-channel FET's Q24 and Q25. This configuration has input and output connections at T2 and T1, respectively, and has a common connection to $+V_{DD}$. The drain current of Q24 is arranged to have the same quiescent value as the drain current of Q1, though of opposite polarity, so these currents do not affect the charge at node N''. The variations in the drain current of Q24 from its quiescent value responsive to variations in the drain current of Q2 from its quiescent value are of the same polarity as the variations in the drain current of Q1 from its quiescent value and combine constructively with them to alter the charge (and thus the potential) at node N''.

Buffer amplifier BA2 comprises a common-source amplifier connection of p-channel FET Q26. Q26 has the potential at node N" applied to its gate electrode, has its source electrode connected to receive $+V_{DD}$ operating potential, has its drain electrode connected to terminal OUT''', and is provided a constant current drain loading by self-biased n-channel FET 27. Proper scaling of the physical dimensions of Q27 and Q3 operates Q24 and Q25 with similar quiescent drain potentials when terminal OUT''' is direct-coupled to $\overline{IN}$ by a direct-coupled feedback network FBN.

FIG. 5 shows a modification that can be made to any of the embodiments of the FIG. 1 feedback amplifier for operating it to amplify input signal voltages. The source VS of input signals is interposed between ground and the IN terminal, replacing the short-circuit connection of FIG. 1. The built-in offset between the quiescent potentials at terminals IN and $\overline{IN}$ permits the input signals to swing either side of ground potential, while at the same time direct-coupled feedback network FBN works against ground potential. Signal by-passing elements may be added to the feedback network to selectively increase the response at terminal OUT to input signals from VS in accordance with conventional practice.

Where quiescent operating potentials permit, Q6 may be replaced by a p-channel source-follower transistor in the FIG. 2 and FIG. 3 circuits, and Q26 may be replaced by an n-channel common-source-amplifier transistor in the FIG. 4 circuit.

Now, Q1 and Q2 have thus far been assumed to be matched in physical dimensions, and FET's carrying the same branch currents as Q1 and Q2 have been assumed to match corresponding transistors in the other branch. Q1 or Q2 and the other FET's in its branch can each be parallelled with a respectively similar FET, however, without departing from the scope of the present invention or other equivalent scaling procedures employed. This, so long as it results in the desideratum that there is a tracking difference in the threshold potentials of Q1 and Q2.

What we claim is:
1. In combination:
    first and second field effect transistors of the same conductivity type, each having respective gate and source and drain electrodes, said first and second field effect transistors being respectively of depletion-mode and enhancement-mode; and
    means for connecting said first and second transistors in long-tailed-pair configuration, including means for supplying tail current to an interconnection to which the source electrodes of said first and second field effect transistors connect without substantial intervening impedance, wherein said means for supplying tail current essentially comprises
    a third field effect transistor being a depletionmode transistor of the same conductivity type as said first and second field effect transistors, having a source electrode connected to a point of reference potential to which the gate electrode of said first field effect transistor connects, having a drain electrode connected to said tail interconnection, and having a gate electrode to which the potential at its source electrode is applied as its gate potential.

2. A combination as set forth in claim 1 arranged to function as a voltage comparator by including in said means for connecting said first and second field effect transistors in long-tailed-pair configuration the following:
    balanced to single-ended signal converter means for providing a single-ended response to the difference between signals received from the drain electrodes of said first and second field effect transistors, respectively.

3. A combination as set forth in claim 2 further including:
    direct-coupled feedback connection means applying at least a portion of said single-ended response to the gate electrode of said second transistor.

4. A combination as set forth in claim 2 including:
    a source-follower field effect transistor having a gate electrode to which said single-ended response is applied, having a common collector electrode connection, and having a source electrode;
    an output terminal at the source electrode of said source-follower field effect transistor; and
    means for applying at least a portion of the potential appearing at said output terminal to the gate electrode of said second field-effect transistor.

5. In combination,
    first and second field effect transistors of the same conductivity type, each having respective gate and source and drain electrodes, said first and second field effect transistors being so made as to exhibit a tracking difference in their respective threshold potentials;
    means for connecting said first and second transistors in long-tailed-pair configuration, including means for supplying tail current to an interconnection to which the source electrodes of said first and second field effect transistors connect without substantial intervening impedance wherein said means for supplying tail current includes a third field effect transistor of the same conductivity type as said first and second field effect transistors, having a source electrode connected to a point of reference potential to which the gate electrode of said first field effect transistor connects, having a drain electrode connected to said tail interconnection, and having a gate electrode;
    means responsive to the drain currents of said first and second transistors departing from a prescribed ratio for providing an error signal, said means including
    a current mirror amplifier having an input connection to which the drain current of one of said first and second field effect transistors is applied as input current and having an output connection for supplying an output current to a node to which the drain current of the other of said first and second field effect transistors is applied, at which node said error signal consequently appears; and
    means biasing the gate electrode of said third field effect transistor respective to its source electrode for conditioning it for substantially constant current flow through its drain electrode.

6. A combination as set forth in claim 5 wherein said first and second transistor are respectively of depletion-mode and enhancement-mode types.

7. A combination as set forth in claim 5 wherein said current mirror amplifier includes a pair of field effect transistors of a conductivity type complementary to that of said first and second field effect transistors, having respective source electrodes connected to a point of operating potential, having respective drain electrodes in respective drain-to-drain interconnections with the drain electrode of said first field effect transistor and with the drain electrode of said second field effect transistor, and having respective gate electrodes at one of said drain-to-drain interconnections, said error signal being supplied at the other of said drain-to-drain interconnections.

8. A combination as set forth in claim 7 wherein said error signal is supplied at the drain-to-drain connection with the drain electrode of said second field effect transistor and wherein said degenerative feedback means comprises:
   a source-follower field effect transistor having a gate electrode connected for receiving said error signal and having a source electrode, and
   means for applying at least a portion of the source electrode potential of said source follower between the gate electrodes of said first and second field effect transistors.

9. A combination as set forth in claim 7 wherein said means for providing an error signal further includes:
   a pair of further field effect transistors of the same conductivity type as said first and second field effect transistors, having respective source electrodes connected to the drain electrode of said first field effect transistor and to the drain electrode of said second field effect transistor, having respective gate electrodes biased to condition these transistors for cascode operation with respective ones of said first and second field effect transistors, and having respective drain electrodes having respective interconnections with separate ones of the input and output connections of said current mirror amplifier.

10. A combination as set forth in claim 9 wherein said current mirror amplifier includes:
    a first pair of field effect transistors of a complementary conductivity type with respect to that of said first and second transistors, having respective source electrodes connected to the common connection of said current mirror amplifier and having respective gate and drain electrodes; and
    a second pair of field effect transistors of said complementary conductivity type, having respective drain electrodes connected to the input connection of said current mirror and to its output connection, having respective gate electrodes to which the input connection of said current mirror amplifier is connected, and having respective source electrodes connected to separate ones of the drain electrodes of the first pair of field effect transistors of said complementary conductivity type, one of the source electrodes of said second pair of field effect transistors of complementary conductivity type being connected to the gate electrodes of said first pair of field effect transistors of said complementary conductivity type.

11. A combination as set forth in claim 7 wherein said error signal is supplied at the drain-to-drain connection with the drain electrode of said first field effect transistor and wherein said degenerative feedback means comprises:
    a common-source-amplifier field effect transistor having a gate electrode connected for receiving said error signal and having a drain electrode, and
    means for applying at least a portion of the drain potential of said common-source-amplifier transistor between the gate electrodes of said first and second field effect transistors.

* * * * *

UNITED STATES PATENT AND TRADEMARK OFFICE
CERTIFICATE OF CORRECTION

PATENT NO. : 4,188,588

DATED : February 12, 1980

INVENTOR(S) : Andrew Gordon Francis Dingwall

It is certified that error appears in the above-identified patent and that said Letters Patent is hereby corrected as shown below:

Col. 1, line 55, "MV." should be --mV.--
Col. 2, line 2, "unblanced" should be --unbalanced--
Col. 6, line 55, delete "and"
between lines 55 and 56 insert the following:
--degenerative feedback means for applying at least a portion of the potential appearing at said output terminal to the gate electrode of said second field effect transistor; and--

Signed and Sealed this

Third Day of June 1980

[SEAL]

Attest:

SIDNEY A. DIAMOND

Attesting Officer

Commissioner of Patents and Trademarks